United States Patent
Yang et al.

(10) Patent No.: US 10,396,191 B2
(45) Date of Patent: Aug. 27, 2019

(54) SEMICONDUCTOR DEVICE

(71) Applicant: EPISTAR CORPORATION, Hsinchu (TW)

(72) Inventors: Ya-Yu Yang, Hsinchu (TW); Chia-Cheng Lui, Hsinchu (TW); Shang-Ju Tu, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 16/023,889

(22) Filed: Jun. 29, 2018

(65) Prior Publication Data
US 2019/0006501 A1  Jan. 3, 2019

(30) Foreign Application Priority Data
Jun. 30, 2017 (TW) .............................. 106121918 A

(51) Int. Cl.
*H01L 29/20* (2006.01)
*H01L 29/207* (2006.01)
*H01L 29/778* (2006.01)

(52) U.S. Cl.
CPC ...... *H01L 29/7783* (2013.01); *H01L 29/2003* (2013.01); *H01L 29/207* (2013.01)

(58) Field of Classification Search
CPC . H01L 29/7783; H01L 29/15; H01L 29/2003; H01L 29/205; H01L 2924/10346; H01L 31/030748; H01L 31/1848
See application file for complete search history.

(56) References Cited

U.S. PATENT DOCUMENTS

| 8,674,409 B2* | 3/2014 | Inoue ................. H01L 29/0843 257/194 |
| 9,761,675 B1* | 9/2017 | Marinella ............ H01L 23/291 |
| 2009/0050936 A1* | 2/2009 | Oka ...................... H01L 29/063 257/192 |

* cited by examiner

*Primary Examiner* — Zandra V Smith
*Assistant Examiner* — Andre C Stevenson
(74) *Attorney, Agent, or Firm* — Muncy, Geissler, Olds & Lowe, P.C.

(57) ABSTRACT

A semiconductor device, including: a channel layer formed on a substrate; a top barrier layer formed on the channel layer, wherein a first heterojunction is formed between the channel layer and the top barrier layer so that a first two-dimensional electron gas is generated in the channel layer; a buffer structure formed between the substrate and the channel layer; a back barrier layer formed between the buffer structure and the channel layer, wherein a second heterojunction is formed between the buffer structure and the back barrier layer so that a second two-dimensional electron gas is generated in the buffer structure; and a source electrode, a drain electrode, and a gate electrode formed on the top barrier layer, respectively; wherein a sheet carrier density of the second two-dimensional electron gas is less than $8E+10$ cm$^{-2}$.

17 Claims, 7 Drawing Sheets

SEMICONDUCTOR DEVICE

CROSS-REFERENCE TO RELATED APPLICATIONS

This application claims priority to and the benefit of Taiwan Application Number 106121918 filed on Jun. 30, 2017, which is incorporated by reference in its entirety.

BACKGROUND

Technical Field

The present disclosure relates to a semiconductor device, more particularly, to a Gallium Nitride (GaN) semiconductor device.

Description of the Related Art

GaN semiconductor devices are capable of conducting large currents and withstanding high voltage so they are becoming popular in the field of power semiconductor industry. The development of GaN semiconductor device is generally focused on the applications of high power or high switching speeds. As to the semiconductor devices for these applications, it generally requires a high electron mobility resulting from the two-dimensional electron gas generated by the GaN-based semiconductor material and the heterojunction structure thereof. Therefore, such semiconductor device is often called heterojunction field effect transistor (HFET) or high electron mobility transistor (HEMT).

FIG. 1 shows a conventional GaN HEMT 10. The GaN HEMT 10 includes a channel layer 16 and a barrier layer 18 grown on a substrate 12 and a buffer layer 14. The channel layer 16 and the barrier layer 18 are epitaxial layers of GaN-based semiconductor materials of different compositions. A source electrode 22, a drain electrode 24, and a gate electrode 20 are made of metal and are provided at a predetermined position on the GaN HEMT 10. Because of the difference in material, the channel layer 16 and the barrier layer 18 have different energy band-gap and therefore a heterojunction 26 is formed in-between. Differences in material lead to different Fermi levels ($E_f$) and Polarization effects. In the vicinity of the heterojunction 26, a potential well with a band gap lower than Fermi level is formed by the energy-band distortion resulting from the sum of polarization directions of the epitaxial layer structure, and a two-dimensional electron gas (2DEG) is induced. In FIG. 1, the 2DEG 28 is induced on a side of the channel layer 16. The electrons of the 2DEG 28 have high mobility, which allows the GaN HEMT 10 to have a low on-resistance ($R_{ON}$).

In practical applications, the phenomenon of additional dynamic $R_{ON}$ or current collapse is one of the issues to be solved in the GaN HEMT industry. It is believed that current collapse is caused by traps generated in GaN HEMTs. During transient operation, electrons are trapped by the defects in the epitaxial layer, which affects the formation of two-dimensional electron gas. This phenomenon results in increased dynamic $R_{ON}$.

SUMMARY OF THE DISCLOSURE

A semiconductor device, including: a channel layer formed on a substrate; a top barrier layer formed on the channel layer, wherein a first heterojunction is formed between the channel layer and the top barrier layer so that a first two-dimensional electron gas is generated in the channel layer; a buffer structure formed between the substrate and the channel layer; a back barrier layer formed between the buffer structure and the channel layer, wherein a second heterojunction is formed between the buffer structure and the back barrier layer so that a second two-dimensional electron gas is generated in the buffer structure; and a source electrode, a drain electrode, and a gate electrode formed on the top barrier layer, respectively; wherein a sheet carrier density of the second two-dimensional electron gas is less than 8E+10 cm$^{-2}$.

A semiconductor device, including: a first heterojunction on a substrate; a second heterojunction between the first heterojunction and the substrate; a source electrode, a drain electrode, and a gate electrode formed on the first heterojunction, respectively; a first two-dimensional electron gas formed between the first heterojunction and the second heterojunction; and a second two-dimensional electron gas formed between the second heterojunction and the substrate; wherein a ratio of a sheet carrier density of the first two-dimensional electron gas to a sheet carrier density of the second two-dimensional electron gas is less than 3%.

DETAILED DESCRIPTION OF THE EMBODIMENTS

Figure 1:
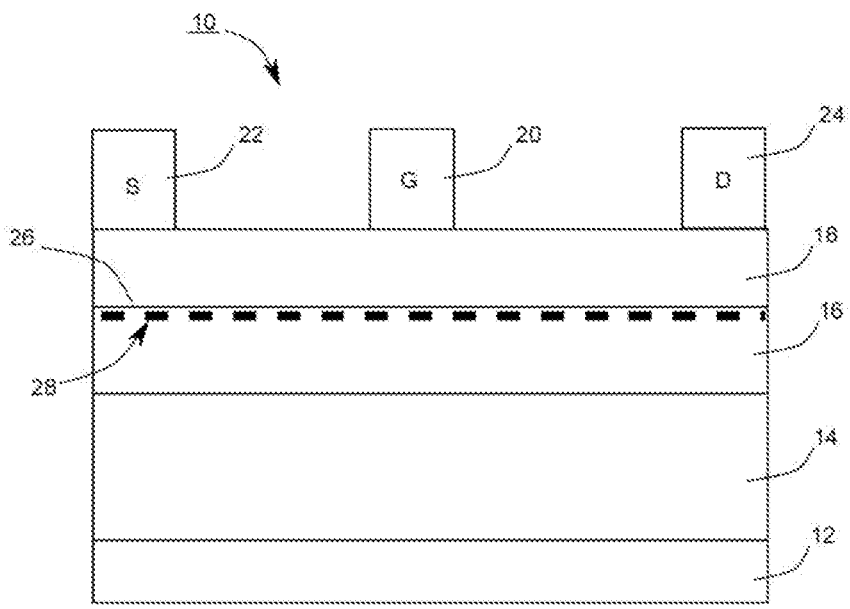
FIG. 1 shows a conventional GaN HEMT.

Reference is made in detail to the preferred embodiments of the present application, examples of which are illustrated in the accompanying drawings. Wherever possible, the same reference numbers are used in the drawings and the description to refer to the same or like parts.

A GaN HEMT, which is a dual-heterojunction device, is provided in one embodiment of the application. The GaN HEMT comprises a first heterojunction and a second heterojunction. The first heterojunction is between a channel layer and a top barrier layer so that a first two-dimensional electron gas (2DEG) is formed near the first heterojunction. The second heterojunction is between a back barrier layer and a buffer structure so that a second two-dimensional electron gas (2DEG) is formed near the second heterojunction.

In the embodiment, a higher potential barrier is generated between the buffer structure and the first 2DEG due to the back barrier layer. During dynamic operation, hot electrons in the first 2DEG are blocked from migrating to the buffer structure. Therefore, opportunity of accumulating hot electrons in the defects of the buffer structure is reduced thereby reducing the phenomenon of current collapse.

In addition to blocking hot electrons in the first 2DEG, sheet carrier density of the second 2DEG in the second heterojunction is smaller than 8E+10 cm$^{-2}$ in accordance with the embodiment of the application. The ratio of the sheet carrier density of the second 2DEG to the sheet carrier density of the first 2DEG is smaller than 3%. Because the sheet carrier density of the second 2DEG can be controlled within a small range, the drain-to-source breakdown voltage ($BV_{DS}$) of the dual-heterojunction device is very high. The drain leakage current varies with the drain-to-source voltage. The drain-to-source breakdown voltage is the maximum drain-to-source voltage when the drain leakage current is smaller than 1E-4 mA in an off-state. The dual-heterojunction device having low drain-to-source leakage current is suitable for the application of high power and high switching frequency.

Figure 2:
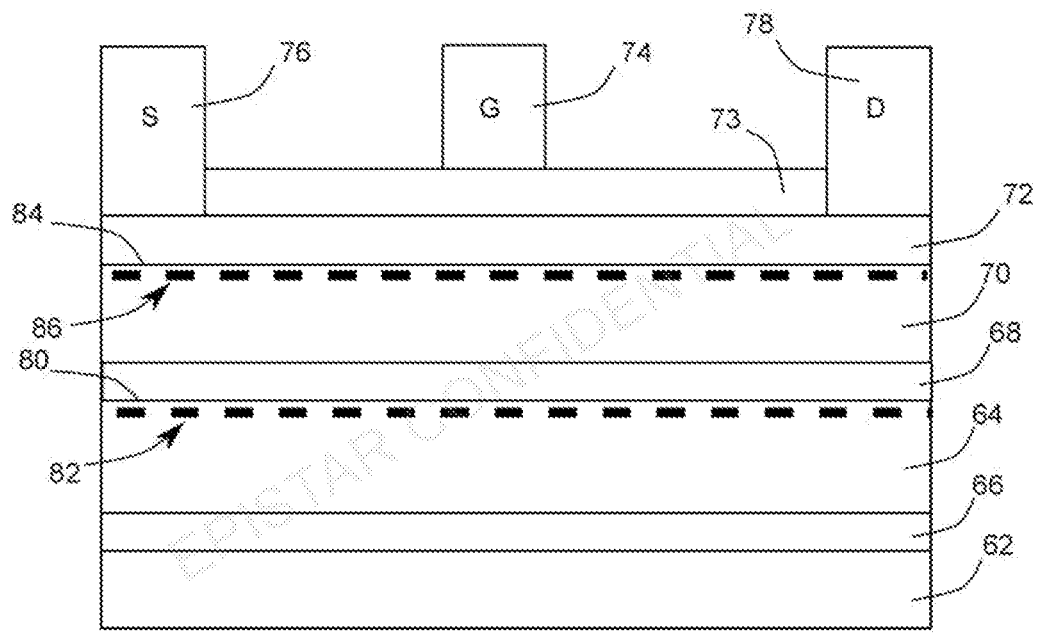
FIG. 2 shows a GaN HEMT 60 in accordance with one embodiment of the present application.

FIG. 2 shows a GaN HEMT 60 in accordance with one embodiment of the application. From the bottom of the GaN HEMT 60 to the top thereof, the GaN HEMT 60 comprises a substrate 62, a nucleation layer 66, a buffer structure 64, and a back barrier layer 68, a channel layer 70, a top barrier layer 72, a cap layer 73, a source electrode 76, a drain electrode 78, and a gate electrode 74.

The substrate 62 is made of silicon or sapphire. In one embodiment, the substrate 62 is a silicon substrate. Compared with sapphire, the silicon substrate has advantages of higher thermal conductivity and better heat dissipation, and is more suitable for high-power devices. Moreover, when the substrate 62 is a silicon substrate, the GaN HEMT can be integrated with the semiconductor device, such as the N-type and P-type MOS devices, on the same substrate. For example, the GaN HEMT device can be integrated with silicon semiconductors which are formed by ion-implantation or epitaxy process on a silicon substrate, on the substrate 62.

The nucleation layer 66 can be considered as a part of the buffer structure 64. The GaN-based material of the GaN semiconductor and the substrate 62 thereof have different lattice constants and thermal expansion coefficients. The buffer structure 64 is used to relieve the strain due to the difference of thermal expansion coefficients and to reduce the lattice defects due to lattice mismatch. The buffer structure 64 can be a single layer composed of a single substance, or a composite layer composed of a plurality of layers. For example, the buffer structure 64 is formed by $Al_xGa_{1-x}N$ layers and GaN layers alternately laminated. In one embodiment, the bottom layer of the buffer structure 64 has a lattice constant substantially the same as the lattice constant of the substrate 62. The top layer of the buffer structure 64 has a lattice constant substantially the same as the lattice constant of the channel layer 70. In one embodiment, the nucleation layer 66 includes aluminum nitride (AlN) and has a thickness between 50 nm and 500 nm and may be 150 nm. In one embodiment, the buffer structure 64 includes a plurality of $Al_xGa_{1-x}N$ layers. The composition of x is between 1 and 0 and gradually varies from the substrate 62 to the channel layer 70. The number of layers may be three. For example, the buffer structure includes three layers of $Al_{0.7}Ga_{0.3}N$ layer, $Al_{0.4}Ga_{0.7}N$ layer, and $Al_{0.1}Ga_{0.9}N$ layer from the substrate 62 up to the channel layer 70. The buffer structure 64 has a total thickness of 0.5 μm to 5.5 μm, and may be 4.5 μm. The buffer structure 64 can be carbon-doped with a doping concentration greater than 1E+18 cm$^{-3}$. Carbon doping makes the buffer structure 64 have high impedance, which prevents the electric charges in the channel layer 70 from penetrating through the buffer structure 64 and causing a leakage phenomenon of punch-through, thereby improving the withstand voltage in a vertical direction of the device. In one embodiment, the upper and lower sides of the buffer structure 64 can suffer a voltage of 600V without breakdown.

The back barrier layer 68 is formed on the buffer structure 64. In one embodiment, the back barrier layer 68 includes undoped $Al_yGa_{1-y}N$, wherein 1≥y>0.3. The back barrier layer 68 has an energy band-gap larger than that of the buffer structure 64. In one embodiment, the back barrier layer 68 has an energy band-gap larger than that of the top layer of the buffer structure 64. In another embodiment, the back barrier layer 68 has an Al composition larger than that of the top layer of the buffer structure 64. The thickness of the back barrier layer 68 is less than 30 nm and may be less than 20 nm such as 10 nm. A heterojunction 80 is formed between the back barrier layer 68 and the buffer structure 64.

The top barrier layer 72 and the channel layer 70 are formed on the back barrier layer 68. In one embodiment, the channel layer 70 includes undoped GaN and has a thickness of between 100 nm and 700 nm and may be greater than 150 nm, for example, 200 nm. The top barrier layer 72 includes undoped $Al_zGa_{1-z}N$, where 0.4≥z>0.1 and z may be 0.25. The thickness of the top barrier layer 72 is between 15 nm and 30 nm and may be 25 nm. As previously described, at the heterojunction 84, the sum of the polarization directions of the epitaxial layers causes the energy band to distort to form potential well below Fermi level, and thus a two-dimensional electron gas 86 is generated. In one embodiment, the value of z and the thickness of the top barrier layer 72 affect the polarity of the top barrier layer 72, the proximity of the potential well to Fermi level at the heterojunction, and the concentration of the two-dimensional electrons gas 86.

A cap layer 73 is formed on the barrier layer 72 and includes undoped GaN. The cap layer 73 reduces the leakage current between the gate electrode 74 and the channel layer 70 under reverse bias.

The gate electrode 74 is formed at a predetermined position on the cap layer 73 and forms a Schottky contact with the cap layer 73. The material of the gate electrode 74 can be refractory metal or a compound thereof, such as Ta, TaN, TiN, W, $WSi_2$ (tungsten silicide), Ni, Au, Pt, alloy of a plurality of metals, or a stack of a plurality of metal layers.

The source electrode 76 and the drain electrode 78 are respectively formed at predetermined positions on the top barrier layer 72 and form an ohmic contact with the top barrier layer 72. The material of the source electrode 76 and the drain electrode 78 can be an alloy of several metals such as Ti, Al, Ni, Au, or a stack of a plurality of metal layers.

The gate-to-source voltage between the gate electrode 74 and the source electrode 76 controls the electrical connection between the gate electrode 78 and the source electrode 76, so that the GaN HEMT 60 becomes a controllable switch. In general, the GaN HEMT 60 is a depletion type transistor, that is, when the gate voltage is 0V, the drain electrode 78 and the source electrode 76 are electrically connected to each other; or, the source voltage is higher than the gate voltage for a specific degree so that the drain electrode 78 and the source electrode 76 can be electrically disconnected from each other.

Figure 3:
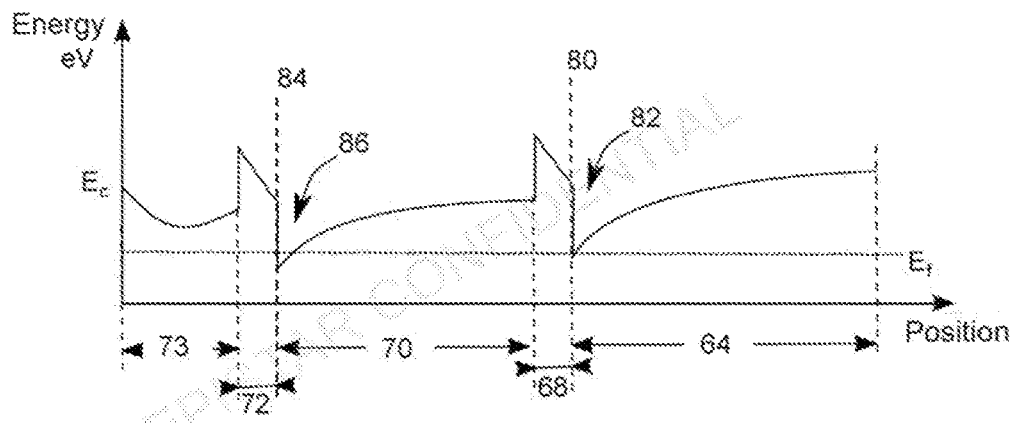
FIG. 3 shows a schematic diagram of a conduction band (Ec) of the GaN HEMT 60 in FIG. 2.

FIG. 3 is a diagram of a conduction band (Ec) of the GaN HEMT 60 in FIG. 2. The heterojunction 84 results in a potential well in the channel layer 70 near the heterojunction 84. Similarly, the heterojunction 80 results in another potential well in the buffer structure 64. As shown in FIG. 3, when no bias is applied on the GaN HEMT 60, Fermi levels (Ef) in each material that are in contact with each other are approximately equal under thermal equilibrium. When the bottom of the potential well is below Fermi level (Ef), the two-dimensional electron gas (2DEG) could be formed in the well. Therefore, in the embodiment, the heterojunction 84 leads to the generation of the two-dimensional electron gas 86 in the channel layer 70, and the heterojunction 80 leads to the generation of the two-dimensional electron gas 82 in the buffer structure 64.

The back barrier layer 68 has two advantages. The first advantage is increasing electric field in the channel layer 70 towards the heterojunction 84 and perpendicular to the two-dimensional electron gas 86, which can force the electrons in the channel layer 70 as close as possible to the heterojunction 84 and away from the buffer structure 64. The second advantage is that the back barrier layer 68 is a potential barrier that blocks electrons in the channel layer 70 from crossing over the barrier layer 68. Both of these advantages can reduce the probability that hot carriers or hot electrons in the two-dimensional electron gas 86 are captured by defects in the buffer structure 64 during dynamic operations. The hot carrier captured by defects in the buffer structure 64 is believed to be one of the major causes of current collapse. Therefore, the back barrier layer 68 improves or reduces the phenomenon of current collapse.

If the back barrier layer 68 is too close to the heterojunction 84, the conduction band would be affected. The carrier sheet density of the two-dimensional electron gas 86 is reduced and the $R_{ON}$ of the GaN HEMT 60 is increased. Therefore, in one embodiment of the present application, the buffer structure 64 can be relatively separated from the two-dimensional electron gas 86 by a thicker channel layer 70, thereby reducing the phenomenon of current collapse. In one embodiment, the thickness of the channel layer 70 is not less than 100 nm, for example, the thickness of the channel layer 70 is 200 nm.

Although the back barrier layer 68 is helpful in reducing current collapse, the two-dimensional electron gas 82 induced by the back barrier layer 68 may have a detrimental effect on the breakdown voltage $BV_{DS}$ between the drain and source. Referring to FIG. 2, when the two-dimensional electron gas 86 in the GaN HEMT 60 is pinched-off and disconnected by a bias voltage, the two-dimensional electron gas 82 may provide a conduction path between the source electrode 76 and the drain electrode 78. As a result, leakage current exists in the GaN HEMT 60 which should be turned off, and the breakdown voltage $BV_{DS}$ may be decreased.

Figures 4A, 4B, 4C:
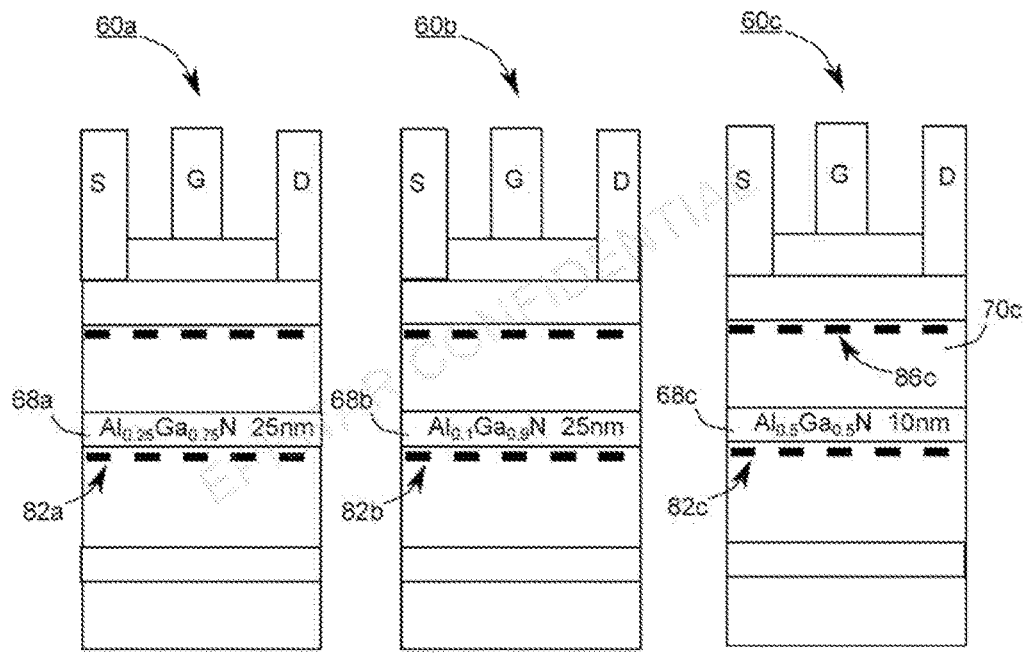
FIGS. 4A, 4B, and 4C are GaN HEMTs 60a, 60b, and 60c in accordance with embodiments of the present application, respectively.

FIGS. 4A, 4B, and 4C show GaN HEMTs 60a, 60b, and 60c in accordance with the embodiments of the present application, respectively. As shown in FIGS. 4A, 4B, and 4C, the GaN HEMTs 60a, 60b, and 60c are substantially the same as each other and have the same structure as that of the GaN HEMT 60. The difference therebetween is the thickness of the back barrier layer and Al composition of the back barrier layer. In GaN HEMT 60a, the back barrier layer 68a has a thickness of 25 nm and is composed of undoped $Al_{0.25}Ga_{0.75}N$. In the GaN HEMT 60b, the back barrier layer 68b has a thickness of 25 nm and is composed of undoped $Al_{0.1}Ga_{0.9}N$. In the GaN HEMT 60c, the back barrier layer 68c has a thickness of 10 nm and is composed of undoped $Al_{0.5}Ga_{0.5}N$.

Figure 5A:
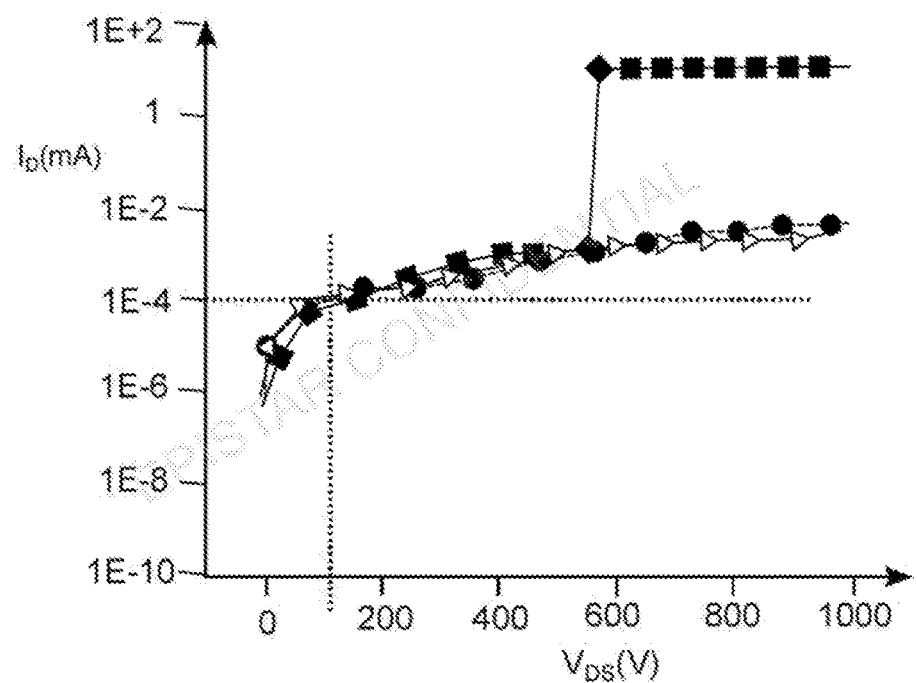
FIGS. 5A, 5B, and 5C respectively show the measurements of the drain-source voltage $V_{DS}$ and the drain current $I_D$ when the GaN HEMTs 60a, 60b, and 60c are turned off.
Figure 5B:
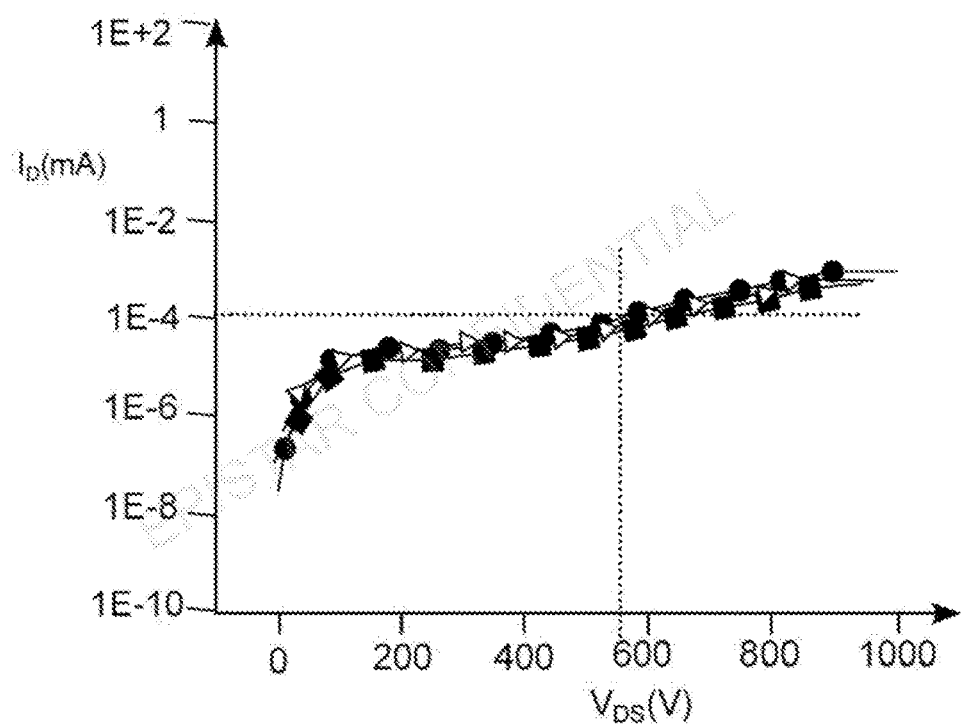
Figure 5C:
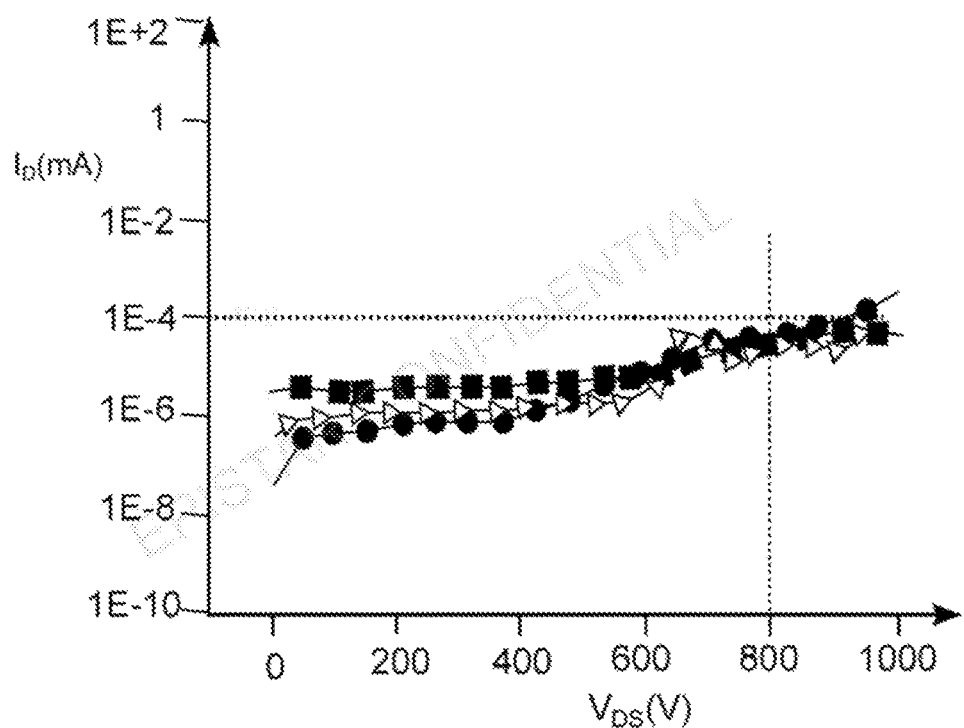

The GaN HEMT 60c has good performance of drain leakage. FIGS. 5A, 5B, and 5C are the measurements of the drain current $I_D$ and the drain-to-source voltage $V_{Ds}$ of the GaN HEMTs 60a, 60b, and 60c in off-state, respectively. Here, the off-state means that the gate voltage is lower than the on-voltage, −3V. Each of FIGS. 5A, 5B, and 5C shows three measured curves corresponding to three GaN HEMTs with the same structure. In contrast, the electrical performance shown in FIG. 5C is the best of the three measured curves, because under the same bias voltage, the drain current $I_D$ in FIG. 5C is lower than that in FIGS. 5A and 5B. If 1E−4 mA is considered as the maximum acceptable drain leakage current, FIG. 5C shows that the drain of the GaN HEMT 60c can withstand more than about 800V. In contrast, as shown in FIGS. 5A and 5B, the GaN HEMTs 60a and 60b only withstand about 100V and 500V, respectively.

Figure 6A:
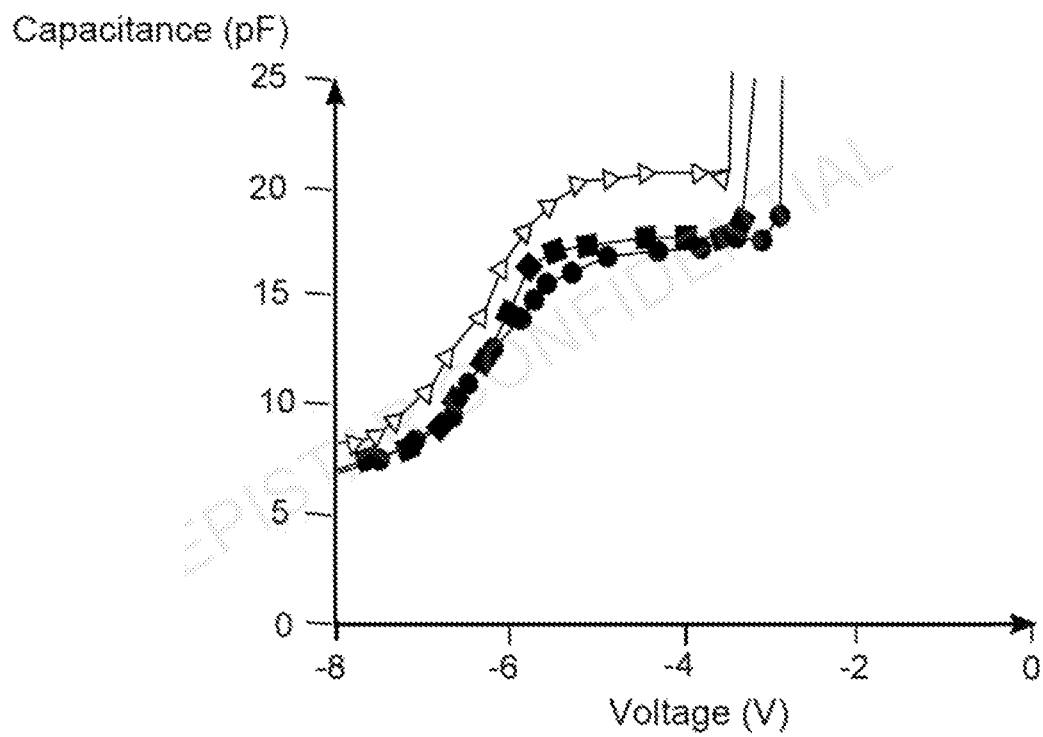
FIGS. 6A, 6B, and 6C show the C-V (capacitance-voltage) curves of the GaN HEMTs 60a, 60b, and 60c, respectively.
Figure 6B:
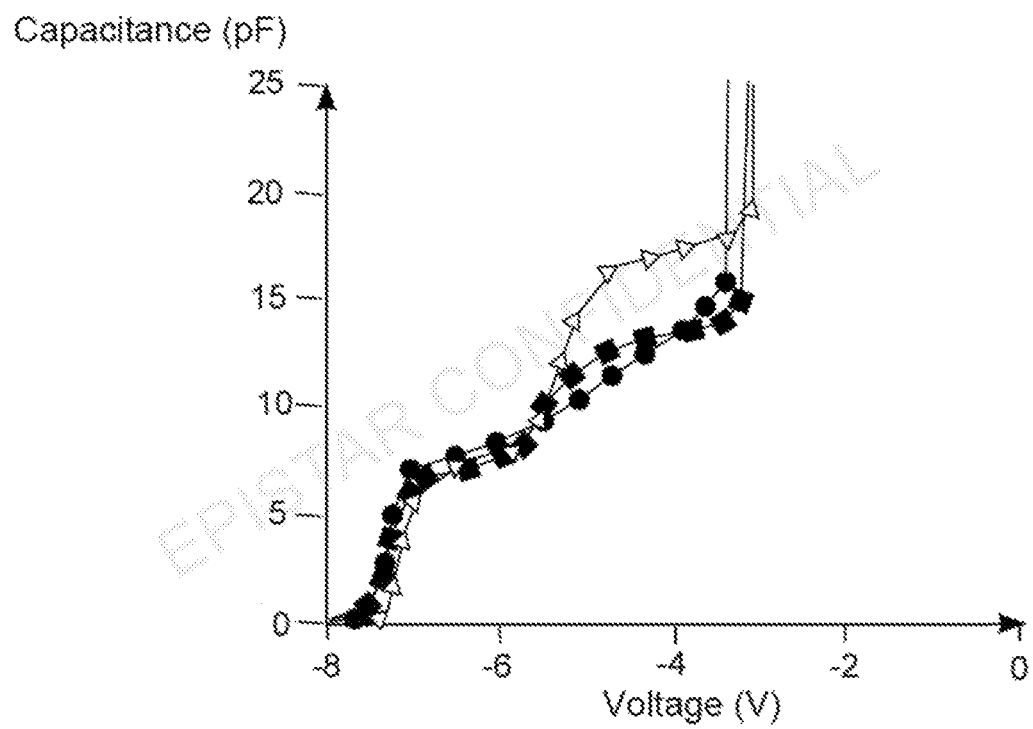
Figure 6C:
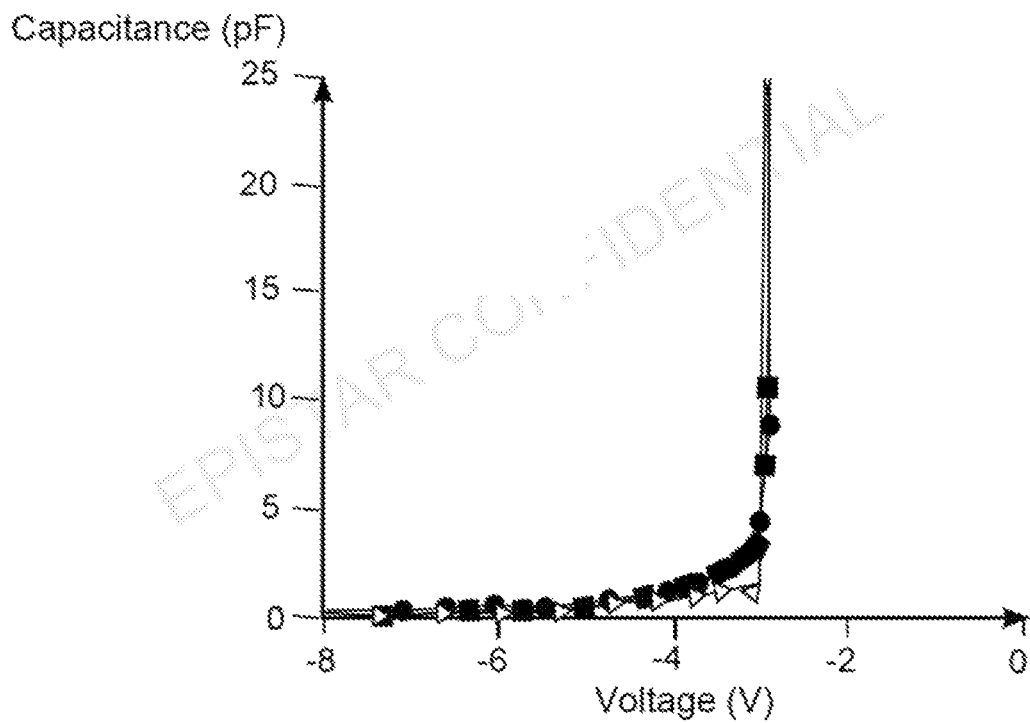

The GaN HEMT 60c makes the carrier surface density of the two-dimensional electron gas 82c very low. FIGS. 6A, 6B, and 6C show the C-V curves (capacitance-voltage) of the GaN HEMTs 60a, 60b, and 60c, respectively. Each of FIGS. 6A, 6B, and 6C shows three C-V curves corresponding to three GaN HEMTs with the same structure. According to the measurements of FIGS. 6A, 6B, and 6C, the capacitance shown in FIG. 6C is significantly lower than that in FIGS. 6A and 6B at the gate voltage lower than −3V, that is, in the off-state. It is supposed that the GaN HEMTs 60a, 60b, and 60c have the two-dimensional electron gas 82a, 82b, and 82c formed in the buffer structure below the back barrier layers 68a, 68b, and 68c, respectively, as shown in FIGS. 4A, 4B, and 4C. From the C-V curves of FIGS. 6A, 6B, and 6C, it can be estimated that the carrier surface densities of the two-dimensional electron gas 82a, 82b, and 82c are approximately $7.16E+11$ $cm^{-2}$, $2.78E+11$ $cm^{-2}$ and $7.96E+10$ $cm^{-2}$, respectively. In other words, the GaN HEMT 60c makes the carrier surface density of the two-dimensional electron gas 82c less than $8E+10$ $cm^{-2}$. From the C-V curve of the GaN HEMT 60c, it can also be estimated that the GaN HEMT 60c can make the carrier surface density of the two-dimensional electron gas 82c not greater than 3% that of the two-dimensional electron gas 86c in the channel layer 70c of the GaN HEMT 60c.

Figure 7A:
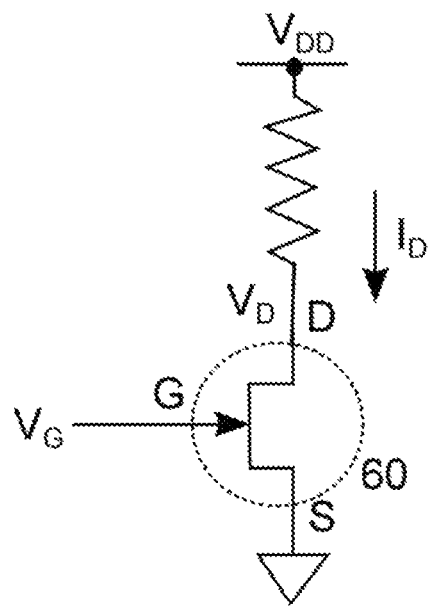
FIG. 7A shows a circuit that can be used to measure the resistance ratio RR of the GaN HEMT 60.
Figure 7B:
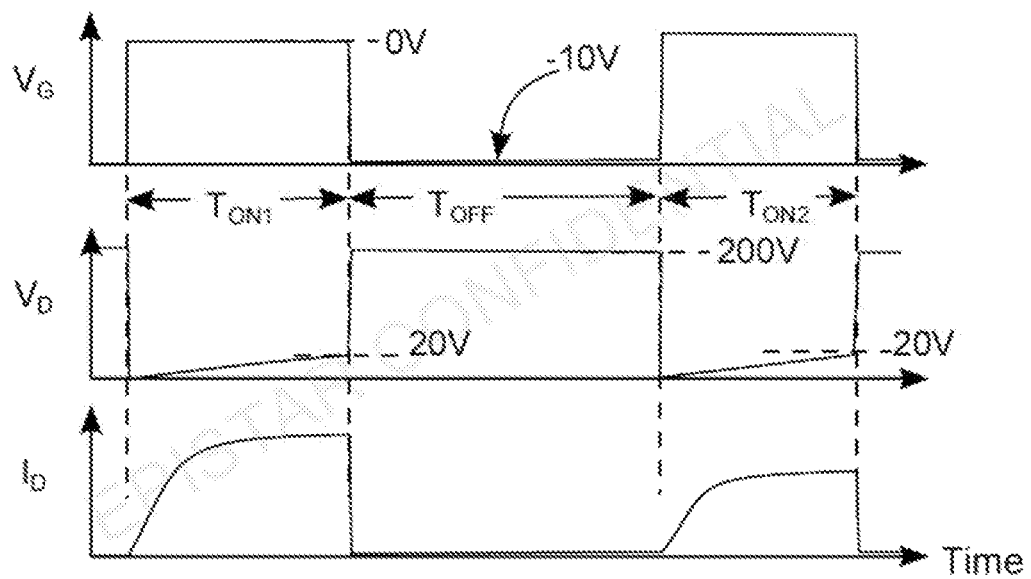
FIG. 7B shows signal waveforms of the drain voltage $V_D$, the gate voltage $V_G$, and the drain current $I_D$ in FIG. 7A.
Figure 7C:
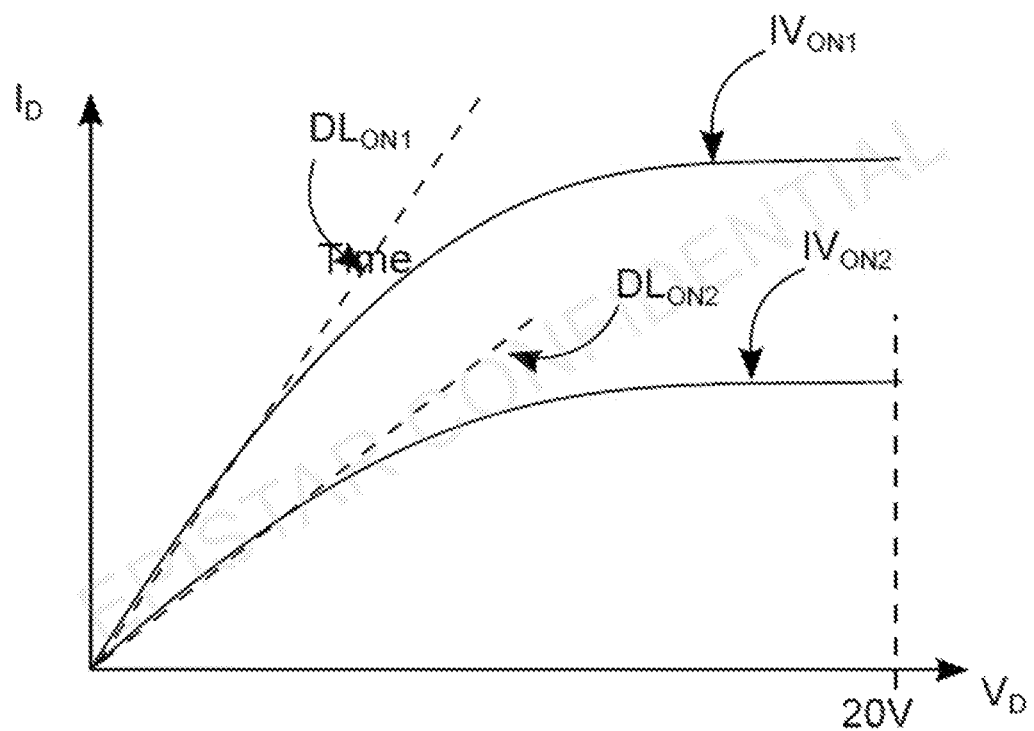
FIG. 7C shows an I-V curve of the drain voltage $V_D$ and the drain current $I_D$ in the GaN HEMT 60.

One indicator for assessing the degree of current collapse is the resistance ratio RR, which is a ratio of the $R_{ON}$ after the off-state stress is applied on to the static $R_{ON}$. The larger resistance ratio RR, the severer the current collapse becomes and the worse the dynamic performance of the device is. For example, FIG. 7A is a circuit that can be used to measure the resistance of GaN HEMT 60 and calculate the resistance ratio RR. FIG. 7B shows signal waveforms of the drain voltage $V_D$, the gate voltage $V_G$, and the drain current $I_D$ in FIG. 7A. By varying the gate voltage $V_G$ of the GaN HEMT 60, the GaN HEMT 60 is in a period of on-state $T_{ON1}$, then in a period of off-state $T_{OFF}$, and then in a period of on-state $T_{ON2}$. For example, the $T_{ON1}$, the $T_{OFF}$, and the $T_{ON2}$ are 1 μs, 10 s, and 60 ms, respectively. During the on-state $T_{ON1}$, the gate voltage $V_G$ remains at 0V and the drain voltage $V_D$ gradually changes from 0V to 20V, and the variation in the drain current $I_D$ is measured. From the $I_D$-$V_D$ curve, a linear region can be defined to calculate $R_{ON1}$, which is the static $R_{ON}$. Then, the GaN HEMT 60 enters the off-state $T_{OFF}$. A bias is applied on the gate to turn off the device. The gate voltage $V_G$ remains at −10V and the drain voltage $V_D$ remains at 200V. Because the GaN HEMT 60 is substantially tuned off, the drain current $I_D$ is about 0 A at this time. After that, the GaN HEMT 60 enters the on-state $T_{ON2}$. The bias condition is the same as in the on-state $T_{ON1}$. Similarly, the variation in the drain current $I_D$ is measured and thereby calculating $R_{ON2}$ from the linear region of the $I_D$-$V_D$ curve. Here, $R_{ON2}$ is the $R_{ON}$ after applying off-state stress. FIG. 7C shows an I-V curve of the drain voltage $V_D$ and the drain current $I_D$ of the GaN HEMT 60. In FIG. 7C, the curves $IV_{ON1}$ and $IV_{ON2}$ are plotted according to the drain voltage $V_D$ and the drain current $I_D$ in the on-states $T_{ON1}$ and $T_{ON2}$, respectively. In the curves $IV_{ON1}$ and $IV_{ON2}$, the linear regions thereof can be represented by the dash lines $DL_{ON1}$ and $DL_{ON2}$, respectively. $R_{ON1}$ and $R_{ON2}$ are the reciprocals of the slopes of the dash lines $DL_{ON1}$ and $DL_{ON2}$, respectively. The resistance ratio RR of the GaN HEMT 60 is calculated by $R_{ON2}/R_{ON1}$. The device has a better performance as the resistance ratio RR is smaller and closer to 1.

The resistance ratios of the GaN HEMT 60a, 60b and 60c in FIGS. 4A, 4B, and 4C are 1.02, 1.02 and 1.00, respectively. Among the three GaN HEMTs, the GaN HEMT 60c has the best resistance ratio RR, indicating that the GaN HEMT 60c has almost no current collapse.

From the experimental results, it can be inferred that increasing the Al composition in the back barrier layer 68 in FIG. 2 can raise the energy band-gap of the back barrier layer 68 and reduce the current collapse. Therefore, the composition of the back barrier layer 68 is represented by $Al_yGa_{1-y}N$ and y is suggested to be between 0.3 and 1. In FIG. 4C, the back barrier layer 68c of the GaN HEMT 60c is made of $Al_{0.5}Ga_{0.5}N$, and the electrical measurement of the GaN HEMT 60c shows almost no current collapse.

In FIG. 2, the back barrier layer 68 including a high Al composition easily forms a two-dimensional electron gas 82 with a high carrier surface density in the buffer structure 64, which results in drain leakage current. In order to reduce the two-dimensional electron gas 82, the back barrier layer 68 of FIG. 2 is suggested to be thin, and the thickness thereof is not more than 30 nm and may be 10 nm. As shown in the electrical measurement of the GaN HEMT 60c in FIG. 4C, the carrier surface density of the two-dimensional electron gas 82c of the GaN HEMT 60c is suppressed to be lower than $8E+10$ cm$^{-2}$ or not greater than 3% of the carrier surface density of the two-dimensional electron gas 86c. The breakdown voltage $BV_{DS}$ of the GaN HEMT 60c reaches about 800V or higher.

In FIG. 2, dopants are added into the barrier layer 68, for example, p-type dopants such as C, Fe, and Mg, to reduce the carrier surface density of the two-dimensional electron gas 82. However, excessive p-type dopants tend to cause defects in the back barrier layer 68, which may have an adverse effect on the operation of the GaN HEMT 60 in FIG. 2. For example, the defects in the back barrier layer 68 may easily capture hot electrons from the channel layer 70, resulting in a worse current collapse phenomenon. Therefore, the other semiconductor layers in the device should be taken into consideration when deciding whether a back barrier layer 68 should be doped or not and what the doping concentration should be. In an embodiment of the present application, the back barrier layer 68 is composed of undoped $Al_yGa_{1-y}N$.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A semiconductor device, comprising:
 a channel layer formed on a substrate;
 a top barrier layer formed on the channel layer, wherein a first heterojunction is formed between the channel layer and the top barrier layer so that a first two-dimensional electron gas is generated in the channel layer;
 a buffer structure formed between the substrate and the channel layer;
 a back barrier layer formed between the buffer structure and the channel layer, wherein a second heterojunction is formed between the buffer structure and the back barrier layer so that a second two-dimensional electron gas is generated in the buffer structure; and
 a source electrode, a drain electrode, and a gate electrode formed on the top barrier layer, respectively;
 wherein a sheet carrier density of the second two-dimensional electron gas is less than $8E+10$ cm$^{-2}$.

2. The semiconductor device of claim 1, wherein the back barrier layer comprises undoped $Al_yGa_{1-y}N$ and wherein $y>0.3$.

3. The semiconductor device of claim 2, wherein a thickness of the back barrier layer is less than 20 nm.

4. The semiconductor device of claim 3, comprising a breakdown voltage $BV_{DS}$, wherein $BV_{DS} \geq 800$ V.

5. The semiconductor device of claim 1, wherein the channel layer comprises GaN and a thickness thereof is greater than or equal to 150 nm.

6. The semiconductor device of claim 1, wherein the buffer structure is carbon-doped and comprises a carbon doping concentration greater than $1E+18$ cm$^{-3}$.

7. The semiconductor device of claim 1, wherein the buffer structure comprises a plurality of layers.

8. The semiconductor device of claim 7, wherein the back barrier layer has an energy band gap larger than that of a top most layer of the plurality of layers.

9. A semiconductor device, comprising:
 a first heterojunction on a substrate;
 a second heterojunction between the first heterojunction and the substrate;
 a source electrode, a drain electrode, and a gate electrode formed on the first heterojunction, respectively;
 a first two-dimensional electron gas formed between the first heterojunction and the second heterojunction; and
 a second two-dimensional electron gas formed between the second heterojunction and the substrate;
 wherein a ratio of a sheet carrier density of the second two-dimensional electron gas to a sheet carrier density of the first two-dimensional electron gas is less than 3%.

10. The semiconductor device of claim 9, wherein the sheet carrier density of the second two-dimensional electron gas is less than $8E+10$ cm$^{-3}$.

11. The semiconductor device of claim 9, further comprising a buffer structure on the substrate; and a back barrier layer on the buffer structure;
 wherein an interface between the buffer structure and the back barrier layer forms the second heterojunction; and
 wherein the back barrier layer comprises undoped $Al_yGa_{1-y}N$ and $y>0.3$, and/or a thickness of the back barrier layer is less than 20 nm.

12. The semiconductor device of claim 11, wherein the buffer structure is carbon-doped and comprises a carbon doping concentration greater than $1E+18$ cm$^{-3}$.

13. The semiconductor device of claim 11, wherein the buffer structure comprises a plurality of layers.

14. The semiconductor device of claim 13, wherein the back barrier layer has an Al composition larger than that of a top most layer of the plurality of layers.

15. The semiconductor device of claim 11, further comprising a channel layer on the substrate; and a top barrier layer on the channel layer;
   wherein an interface between the channel layer and the top barrier layer forms the first heterojunction.

16. The semiconductor device of claim 15, wherein the channel layer comprises GaN and/or a thickness thereof is greater than or equal to 150 nm.

17. The semiconductor device of claim 11, wherein the buffer structure comprises a thickness of 0.5 μm to 5.5 μm.

* * * * *